(12) United States Patent
Chew et al.

(10) Patent No.: US 8,305,772 B2
(45) Date of Patent: Nov. 6, 2012

(54) CIRCUIT WITH AN INTEGRATED SHIELD AND HEARING AID

(75) Inventors: Leep Foong Chew, Singapore (SG); Raymond Kang, Singapore (SG); Meng Kiang Lim, Singapore (SG); Chow Lan Stella Yap, Singapore (SG)

(73) Assignee: Siemens Medical Instruments Pte. Ltd., Singapore (SG)

( * ) Notice: Subject to any disclaimer, the term of this patent is extended or adjusted under 35 U.S.C. 154(b) by 518 days.

(21) Appl. No.: 12/371,142

(22) Filed: Feb. 13, 2009

(65) Prior Publication Data
US 2009/0201652 A1 Aug. 13, 2009

(30) Foreign Application Priority Data
Feb. 13, 2008 (DE) .................. 10 2008 008 897

(51) Int. Cl.
*H05K 9/00* (2006.01)
(52) U.S. Cl. ............................................. 361/818
(58) Field of Classification Search .......... 361/818, 361/816, 800; 174/254
See application file for complete search history.

(56) References Cited

U.S. PATENT DOCUMENTS

| | | | |
|---|---|---|---|
| 4,675,625 A | 6/1987 | Johnston | |
| 4,792,879 A * | 12/1988 | Bauknecht et al. | 361/816 |
| 4,912,769 A | 3/1990 | Erbe | |
| 4,922,059 A | 5/1990 | Walker et al. | |
| 4,979,787 A * | 12/1990 | Lichtenberger | 385/88 |
| 5,031,027 A | 7/1991 | Dorinski et al. | |
| 5,265,322 A * | 11/1993 | Fisher et al. | 29/848 |
| 5,434,362 A * | 7/1995 | Klosowiak et al. | 174/254 |
| 6,674,869 B2 | 1/2004 | Paczkowski | |
| 7,639,513 B2 * | 12/2009 | Otsuki | 361/818 |
| 2006/0043562 A1 | 3/2006 | Watanabe | |
| 2006/0067070 A1 | 3/2006 | Otsuki | |
| 2009/0201652 A1 * | 8/2009 | Chew et al. | 361/749 |

FOREIGN PATENT DOCUMENTS

DE 43 03 908 A1 8/1994

(Continued)

OTHER PUBLICATIONS

De Jong et al.: "3D Integration with PCB Technology", Applied Power Electronics Conference and Exposition, 2006—APEC '06—Twenty-First Annual IEEE Mar. 19, 2006, Piscataway, NJ, USA, pp. 857-863, XP010910045.
European Search Report dated Mar. 11, 2010.

*Primary Examiner* — Neil Abrams
(74) *Attorney, Agent, or Firm* — Laurence A. Greenberg; Werner H. Stemer; Ralph E. Locher

(57) ABSTRACT

A flexible printed circuit board having an integrated shield, a circuit based thereon, and a hearing aid having the circuit, are provided. The flexible printed circuit board includes a mount layer, a metallization layer and a shielding layer for shielding against electromagnetic interference influences. It can be bent about a respective bending axis in at least two different bending areas, in which the two bending axes are at an angle of at least 45 degrees to one another. The shielding layer extends at least over the two bending areas. A circuit based on the printed circuit board can be fitted with electronic components in at least one circuit area and can be bent in the bending areas in such a way that the circuit area is shielded by the shielding layer against electromagnetic interference influences in at least three spatial directions which are substantially at right angles to one another.

7 Claims, 5 Drawing Sheets

FOREIGN PATENT DOCUMENTS

| | | |
|---|---|---|
| GB | 2173048 A | 10/1986 |
| JP | 6224587 A | 8/1994 |
| JP | 2003-142875 A | 5/2003 |
| JP | 2004-128418 A | 4/2004 |

* cited by examiner

CIRCUIT WITH AN INTEGRATED SHIELD AND HEARING AID

CROSS-REFERENCE TO RELATED APPLICATION

This application claims the priority, under 35 U.S.C. §119, of German Patent Application DE 10 2008 008 897.8, filed Feb. 13, 2008; the prior application is herewith incorporated by reference in its entirety.

BACKGROUND OF THE INVENTION

Field of the Invention

The invention relates to a flexible printed circuit board having an integrated shield, a circuit based thereon as well as a hearing aid having such a circuit.

Hearing aids are used to compensate for a hearing loss of the hearing-aid wearer. They are intended to do that in a manner which is as free as possible of faults, in very different situations and environments. In order to make it possible to provide useful hearing assistance in different noise environments, it is normal practice to use respectively adapted hearing programs and adaptive filters. Those and other functions, such as the suppression of feedback or noise, require extensive and complex electronic control.

Electronic control is normally in the form of a digital circuit. In the control field, particularly in the area of signal inputs and signal outputs, analog circuit parts and signals are also used. Numerous electrical signals, generally analog signals, also occur in the vicinity of the hearing aid and of the hearing-aid wearer. All electromagnetic signals in the area surrounding the control and in the vicinity of the hearing aid can affect the operation of the control, as interference influences. That is referred to as EMI (Electromagnetic Interference).

It is known for electromagnetic shielding measures to be taken in order to suppress or at least to reduce the influence of electromagnetic interference signals on the control function. For example, parts of the housing of the hearing aid or the entire housing can be provided with an electrically conductive, shielding coating. Instead of that, the housing may be produced from a material with shielding characteristics. That admittedly makes it possible to shield or at least reduce electromagnetic signals from outside the housing. However, because of the openings for the microphone and the receiver, points necessarily remain at which interference signals can pass through the housing. Furthermore, capabilities are frequently provided for programming the hearing aid without the use of cables or for allowing desired electromagnetic signals to be passed, for example, to a telephone coil in the interior of the housing. Shielding windows are likewise required in the housing for that purpose. It is therefore impossible to use the housing to provide shielding that is as effective as possible for control purposes.

Japanese Applications JP 2003-142875 A and JP 2004-128418 A have disclosed circuits for mobile telephones in which shielding elements are integrated in the respective circuit mounts. The shielding elements are each provided on sections of the circuit mounts where there are no conductor tracks or electrical components. The circuit mounts are composed of flexible material and are bent such that the shielding elements are disposed above or below the circuit components to be shielded. That results in the circuit being shielded in just one direction.

German Published, Non-Prosecuted Patent Application DE 43 03 908 A1 discloses a housing for a controller for a motor vehicle, which includes a flexible printed circuit board in three parts. Aluminum plates are mounted on two parts of the printed circuit board and are folded onto the frame of the housing. The housing is thus closed, and is shielded against radio-frequency radiation.

In general, electromagnetic interference signals are not restricted to one source direction. Depending on the environment, widely differing sources may occur for interference signals in many directions. Additional factors are that reflections may possibly occur and the fact that the respective circuit may be used in a mobile appliance which is moved and rotated continuously by the user. That applies to circuits in hearing aids in the same way as in mobile telephones and a multiplicity of further applications. The multiplicity of electronic appliances in daily-use environments result in just as many applications in which there is a requirement for more effective shielding of electronic circuits.

SUMMARY OF THE INVENTION

It is accordingly an object of the invention to provide a hearing aid and an electronic circuit, in particular for controlling a hearing aid, with an integrated shield against electromagnetic interference signals, which overcome the hereinafore-mentioned disadvantages of the heretofore-known devices of this general type and in which the shield is more effective and at the same time less complex to manufacture.

With the foregoing and other objects in view there is provided, in accordance with the invention, a flexible printed circuit board, comprising a mount layer, a metallization layer, a shielding layer for shielding against electromagnetic interference influences, and at least two different bending areas each having a respective bending axis about which the printed circuit board can be bent. The two bending axes are disposed at an angle of at least 45 degrees to one another and the shielding layer extends at least over the two bending areas.

In accordance with another feature of the invention, the two bending axes are at an angle of substantially 90 degrees to one another. In a further preferred embodiment, the printed circuit board has an L-shaped outline.

A printed circuit board such as this is used to produce a circuit by bending the printed circuit board around the bending areas. Since the shielding layer extends over at least two bending areas which are not parallel, the bending process results in a shielding effect in at least two different directions. The entire printed circuit board can thus be constructed such that an area which is surrounded to a greater or lesser extent is created by the bending process. Electronic components, for example a digital control, of the circuit can be disposed within the surrounded area and are then shielded against electromagnetic interference influences in at least two directions. Depending on the extent of the shielding layer within the flexible printed circuit boards, this therefore also allows a shielding effect to be achieved in three or four directions.

In addition, this results in the advantage that the printed circuit board can be produced integrally with integrated shielding areas and without additional process steps. The production process as described in the following text for a circuit using a printed circuit board such as this means that a circuit which is shielded against interference signals in a plurality of spatial directions can be produced in an uncomplex manner without any need to add a separate shielding apparatus in additional process steps. Furthermore, the lack of a separate shielding apparatus also results in a circuit which saves space and is less complex.

In accordance with a further feature of the invention, the flexible printed circuit board has three different bending areas, in which the flexible printed circuit board can be bent about a respective bending axis, wherein two bending axes are parallel to one another and are at right angles to the third bending axis, and wherein the shielding layer extends at least over the three bending areas. In a further preferred embodiment, the flexible printed circuit board has a substantially T-shaped outline.

This results in the advantage that bending of the printed circuit board around the bending areas results in the production of a circuit which is shielded against electromagnetic interference influences in at least three directions. Depending on the extent of the shielding areas, shielding can also be achieved in four or five directions. Electrical components can thus be disposed on the printed circuit board in such a way that they are shielded against interference signals in five spatial directions by the bending areas or shielding areas.

If a further bending area, which may be in the form of a shielding area, is provided, shielding can be achieved in six spatial directions. Assuming appropriate configuration of the bending areas and shielding areas, it is thus possible to achieve a surrounded area which is shielded against interference signals in all directions.

With the objects of the invention in view, there is also provided a circuit formed on a flexible printed circuit board. The circuit and flexible printed circuit board comprising a mount layer, a metallization layer, a shielding layer for shielding against electromagnetic interference influences, at least two different bending areas each having a respective bending axis about which the printed circuit board can be bent, two of the bending axes being disposed at right angles to one another, at least one circuit area, electronic components disposed in the at least one circuit area, and at least two different printed circuit board areas separated from one another by bending areas. The shielding layer extends over the at least two different printed circuit board areas and over the two bending areas, and the printed circuit board is bent in the bending areas for shielding the at least one circuit area with the shielding layer against electromagnetic interference influences in at least three directions substantially at right angles to one another.

With the objects of the invention in view, there is furthermore provided a circuit formed on a flexible printed circuit board. The circuit and flexible printed circuit board comprising a mount layer, a metallization layer, a shielding layer for shielding against electromagnetic interference influences, at least one circuit area, electronic components disposed in the at least one circuit area, at least three different bending areas each having a respective bending axis about which the printed circuit board can be bent, two of the bending axes being parallel to one another and at right angles to a third bending axis, and at least two different printed circuit board areas separated from one another by bending areas. The shielding layer extends over the at least two different printed circuit board areas and over the three bending areas, and the printed circuit board is bent in the bending areas for shielding the at least one circuit area with the shielding layer against electromagnetic interference influences in at least four directions substantially at right angles to one another.

In accordance with another feature of the invention, the metallization layer and the shielding layer are composed of the same conductive material. This simplifies the construction and production of the printed circuit board, and therefore of the circuit as well.

In accordance with a further feature of the invention, conductive structures of the metallization layer and the shielding layer are produced by removal of conductive material from the same conductive layer. The dual function of the metallization layer and dispensing with an additional layer results in a thinner and more flexible printed circuit board.

In accordance with an added feature of the invention, a layer which contains gold is provided for shielding against electromagnetic interference influences. By virtue of its electrical characteristics, gold is particularly suitable for use in a shielding layer and in a metallization layer.

In accordance with an additional feature of the invention, the printed circuit board is bent in the bending areas in such a way that the printed circuit board areas bound a circuit volume which includes at least one side of the circuit area, and the circuit volume is encapsulated. This results in a circuit which is shielded on all sides against electromagnetic interference signals being constructed in a more compact and more robust form. In one advantageous refinement, the circuit volume is encapsulated with epoxy resin.

With the objects of the invention in view, there is concomitantly provided a hearing aid having a circuit as described above, which is a fundamental concept of the invention.

Other features which are considered as characteristic for the invention are set forth in the appended claims.

Although the invention is illustrated and described herein as embodied in a circuit with an integrated shield and a hearing aid, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
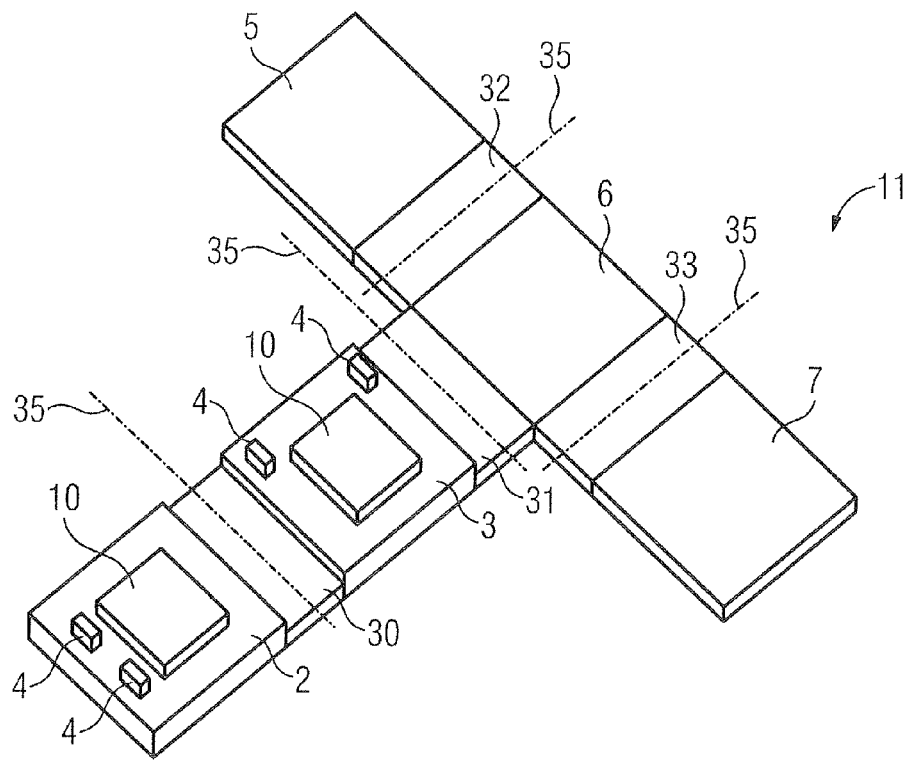
FIG. 1 is a diagrammatic, perspective view of T-shaped printed circuit board.

Referring now to the figures of the drawings in detail and first, particularly, to FIG. 1 thereof, there is seen a diagrammatic illustration of a T-shaped flexible printed circuit board 11 with integrated shielding. The printed circuit board 11 has circuit areas 2, 3 which are fitted with electronic components. The electronic components are surface mounted devices 4 and ICs 10, in addition to conductor tracks which are not illustrated. The circuit area 2 is separated from the circuit area 3 by a bending area 30 which is sufficiently flexible to ensure a high level of bending variability. An outline of the bending area 30 results in a preferred direction for a bend, which runs along a bending axis 35.

A further bending area 31 separates the circuit area 3 from a printed circuit board area 6. Further bending areas 32, 33 separate the printed circuit board area 6 from further printed circuit board areas 5, 7. In this case, the bending areas 32, 33 and their bending axes 35 are disposed parallel to one another and at right angles to the bending area 31. This results in the printed circuit board 11 having a T-shaped outline. The bending areas 31, 32, 33 are each identified by bending axes 35, and each ensure a high degree of bending variability.

A shielding layer is integrated in the flexible printed circuit board 11 and provides shielding, or at least reduces, electromagnetic interference signals (EMI). The shielding layer is integrated in the layer structure of the printed circuit board 11 as an autonomous layer or as a layer component, or as a coating, and cannot be illustrated in the figure. It extends over the bending areas 31, 32, 33 and additionally over the printed circuit board areas 5, 6, 7.

Depending on the embodiment of the printed circuit board 11 and depending on its purpose, the shielding layer may also extend only over the bending areas 31, 32, 33 or in addition thereto only over some of the printed circuit board areas 5, 6, 7.

Figure 2:
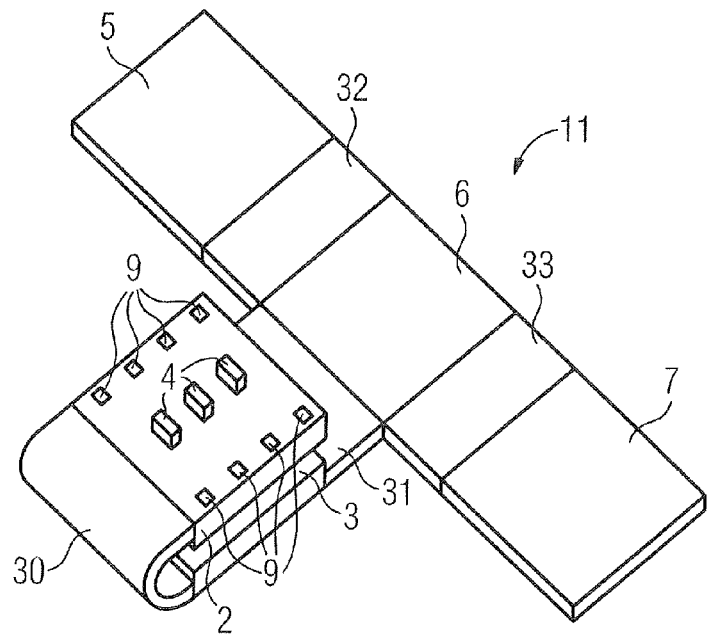
FIG. 2 is a perspective view of a T-shaped printed circuit board, bent once.

FIG. 2 illustrates the printed circuit board 11 as described above, with the circuit area 2 being bent around the bending area 30. The circuit area 2 is thus disposed over the circuit area 3, to be precise in such a way that the lower face of the circuit area 2 faces upwards. The lower face is fitted with surface mounted devices 4 and bond pads 9.

Figure 3:
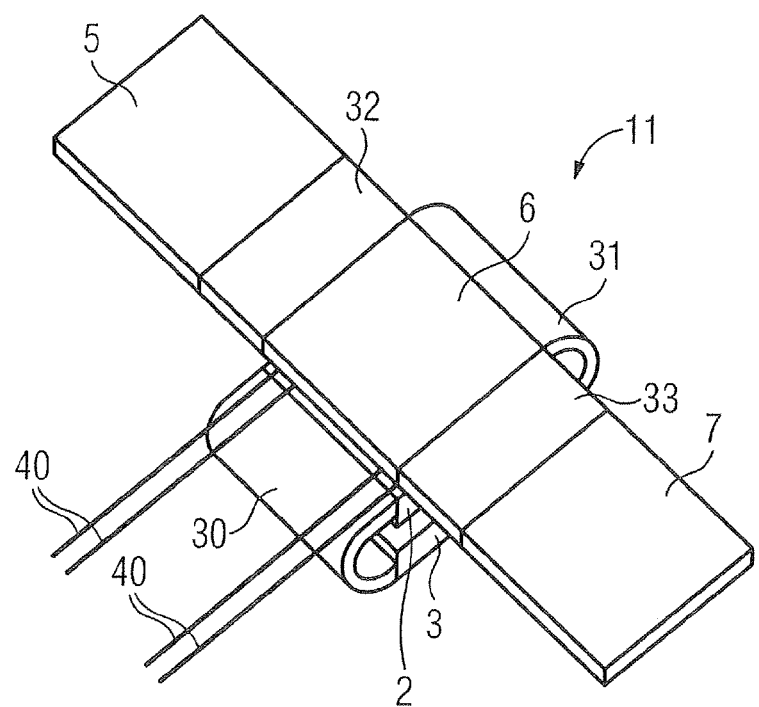
FIG. 3 is a fragmentary, perspective view of a T-shaped printed circuit board, bent twice.

FIG. 3 once again illustrates the printed circuit board 11, with the printed circuit board areas 5, 6, 7 (the upper bar of the T) being bent around the bending area 31. The printed circuit board areas 5, 6, 7 are thus disposed over the circuit area 2, to be precise with the lower face facing upwards. In addition, bonding wires 40 are shown, which have been bonded to the bond pads 9.

Figure 4:
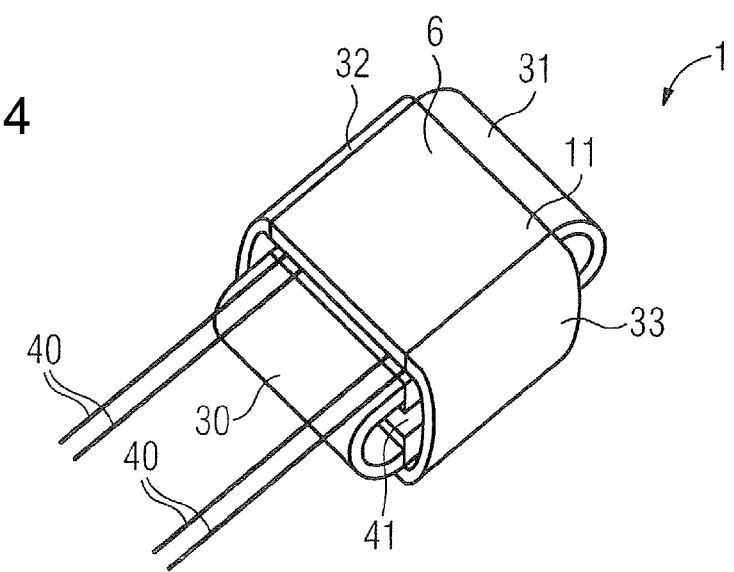
FIG. 4 is a fragmentary, perspective view of a circuit formed of a T-shaped printed circuit board.

FIG. 4 once again shows the printed circuit board 11, with the printed circuit board areas 5, 7 having been bent around the bending areas 32, 33 under the circuit area 3. This results in the final configuration of the printed circuit board 11.

The printed circuit board 11 therefore surrounds a circuit volume 41. Outer walls are formed by the printed circuit board areas 6, 5 and 7 (depending on the bending sequence) and by the bending areas 30, 31, 32, 33.

In this final configuration, the printed circuit board 11 forms a circuit 1. Since the circuit 1 has been produced by bending (or folding) of the printed circuit board 11, this technique is also referred to as origami.

The surrounded circuit volume 41 is encapsulated with epoxy resin. This provides robustness for the circuit 1 that is created from the printed circuit board 11. In addition, the electronic components (surface mounted devices 4, ICs 10) are encapsulated and electrically isolated in the surrounded circuit volume 41.

Since the shielding layer extends over the outer bending areas 30, 31, 32, 33 and the outer printed circuit board areas 6 and 5 as well as 7, the surrounded circuit volume 41, together with the electronic components located therein, is shielded against electromagnetic interference signals.

Figure 5:
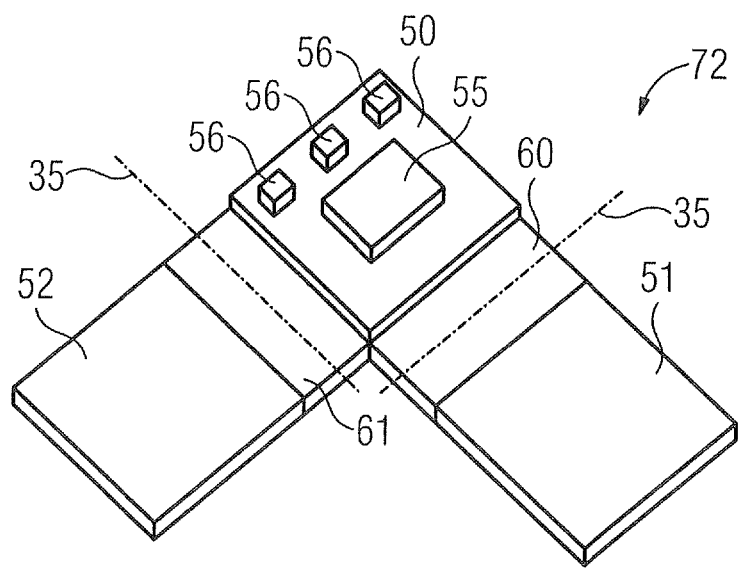
FIG. 5 is a perspective view of an L-shaped printed circuit board.

FIG. 5 diagrammatically illustrates an L-shaped flexible printed circuit board 72 with integrated shielding. The printed circuit board 72 has a circuit area 50 which is fitted with electronic components. The electronic components are surface mounted devices 56 and an IC 55, in addition to conductor tracks which are not illustrated. The circuit area 50 is separated from the printed circuit board areas 51, 52 by bending areas 60, 61. The bending areas are sufficiently flexible to ensure a high degree of bending variability. An outline of the bending areas 60, 61 in each case results in a preferred bending direction, which runs along the bending axes 35.

In this case, the bending areas 60, 61 and their bending axes 35 are disposed at right angles to one another. This results in the printed circuit board 72 having an L-shaped outline.

A shielding layer, which shields or at least reduces electromagnetic interference signals (EMI), is integrated in the flexible printed circuit board 72. The shielding layer is integrated in the layer structure of the printed circuit board 72 as an autonomous layer, as a layer component or as a coating, and cannot be illustrated in the figure. It extends over the bending areas 60, 61 and, additionally, over one of the two printed circuit board areas 51, 52.

Depending on the embodiment of the printed circuit board 11 and depending on its purpose, the shielding layer may also extend only over the bending areas 60, 61 or, in addition to this, only over both printed circuit board areas 51, 52.

Figure 6:
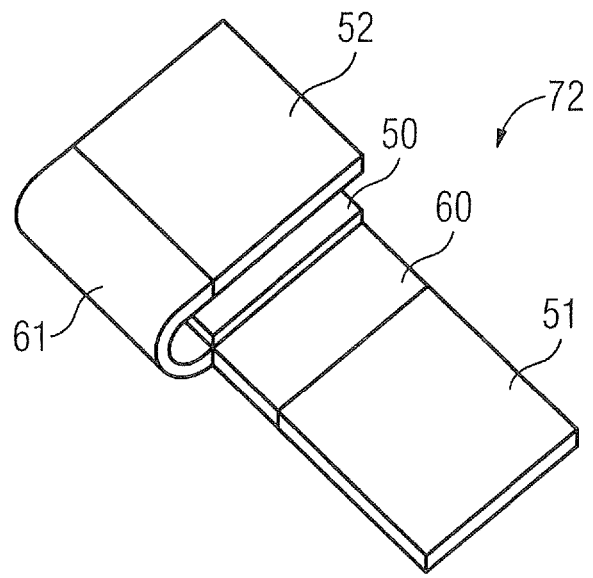
FIG. 6 is a perspective view of an L-shaped printed circuit board, bent once.

FIG. 6 illustrates the printed circuit board 72 as described above, with the printed circuit board area 52 being bent around the bending area 61. The printed circuit board area 52 is therefore disposed above the circuit area 50, to be precise with the lower face of the printed circuit board area 52 facing upwards.

Figure 7:
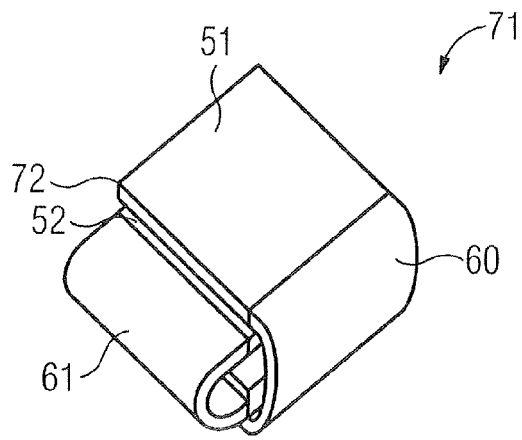
FIG. 7 is a perspective view of a circuit formed of an L-shaped printed circuit board.

FIG. 7 once again shows the printed circuit board 72 as described above, with the printed circuit board area 51 being bent around the bending area 60. The printed circuit board area 51 is therefore disposed above the printed circuit board area 52 and above the circuit area 50, to be precise with the lower face facing upwards.

This results in the final configuration of the printed circuit board 72, in which it surrounds a circuit volume in four spatial directions. In the illustration, these are the spatial directions facing the viewer, whereas the spatial directions facing away from the viewer are not surrounded. Outer walls of the surrounded circuit volume are formed by the printed circuit board area 51 and by the bending areas 60, 61.

In this final configuration, the printed circuit board 72 forms a circuit 71. Since the shielding layer extends above the outer bending areas 60, 61 and the outer printed circuit board area 51 or 52, the surrounded circuit volume, with the electronic components located therein, is shielded in three spatial directions against electromagnetic interference signals.

Figure 8:
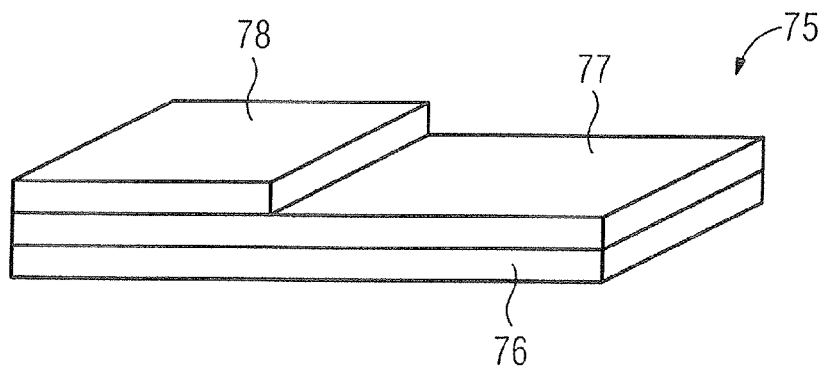
FIG. 8 is a perspective view of a printed circuit board with a separate shielding layer and metallization layer.

FIG. 8 diagrammatically illustrates a flexible printed circuit board 75. This includes an electrically insulating mount layer 77 and a shielding layer 76 underneath it. The shielding layer 76 is formed from an electrically conductive material which is suitable for shielding purposes, or includes such material. Copper or gold are preferably used. A metallization layer 78, from which the conductor tracks are normally produced by lithographic methods, is located above the mount layer 77. This configuration of a metallization layer 78, a mount layer 77 and a shielding layer 76 allows complete shielding to be achieved for the entire printed circuit board area against electromagnetic interference signals, even on the surface opposite the circuit area at the rear.

Figure 9:
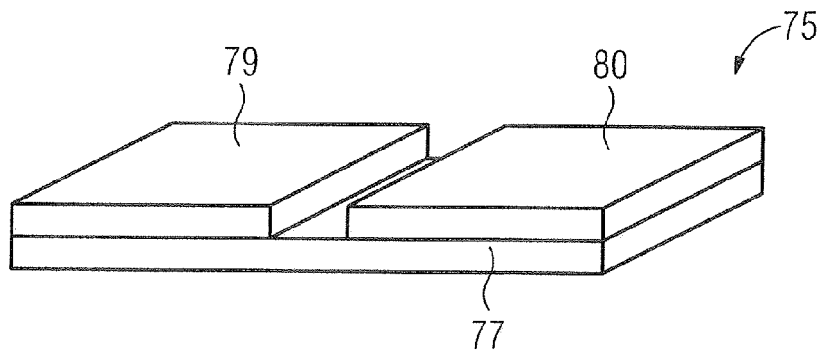
FIG. 9 is a perspective view of a printed circuit board with a common shielding layer and metallization layer.

FIG. 9 diagrammatically illustrates a flexible printed circuit board 75 having a layer structure which is reduced by one stratum. A metallization layer 79 and a shielding layer 80 are disposed above a mount layer 77. In the layer structure, the metallization layer 79 and the shielding layer 80 are disposed in one and the same stratum. This stratum of the layer structure is based on a material which is suitable not only for the production of conductor tracks but also for production of a shield. Copper or gold are preferably used. Lithographic methods are used on one hand to form the conductor tracks on the metallization layer 79 and on the other hand to separate the shielding layer 80 from the metallization layer 79. A printed circuit board constructed in this way is more flexible because of the reduced number of strata, but is not shielded against electromagnetic interference signals over the entire area.

Figure 10:
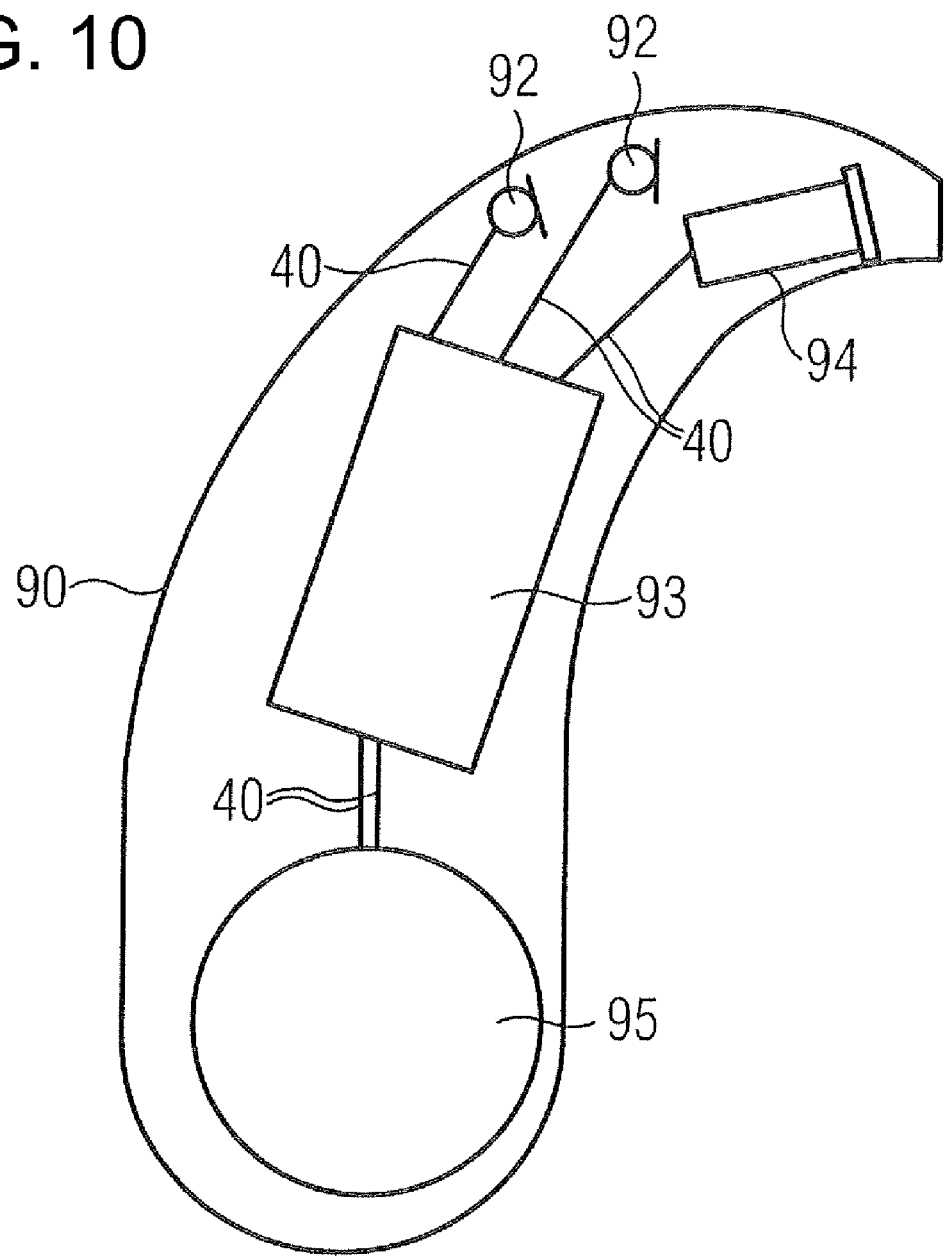
FIG. 10 is a side-elevational view of a hearing aid.

FIG. 10 schematically illustrates a hearing aid 90. A battery 95, which produces electrical energy required for operation of an electrical circuit 93, is located within a housing of the hearing aid 90. The electrical circuit 93 is used to control the hearing aid 90, to be precise to control operation and functions, for example hearing programs. Microphones 92 and a receiver 94 are therefore connected not only to the battery 95 but also to the circuit 93.

The electrical circuit 93 is shielded against electromagnetic interference signals both from outside the housing and from the components within the housing. In order to achieve this shielding, it is constructed as described above in conjunction with FIG. 4 and FIG. 7.

The invention can be summarized as follows: The invention relates to a flexible printed circuit board having an integrated shield, to a circuit based thereon, and to a hearing aid having such a circuit. The flexible printed circuit board includes a mount layer, a metallization layer and a shielding layer for shielding against electromagnetic interference influences. It can be bent about a respective bending axis in at least two different bending areas, wherein the two bending axes are at an angle of at least 45 degrees to one another. The shielding layer extends at least over the two bending areas. A circuit based on such a printed circuit board can be fitted with electronic components in at least one circuit area and can be bent in the bending areas in such a way that the circuit area is shielded by the shielding layer against electromagnetic interference influences in at least three spatial directions which are substantially at right angles to one another.

The invention claimed is:

1. A circuit formed on a flexible printed circuit board, the circuit and flexible printed circuit board comprising:
   a mount layer;
   a metallization layer;
   a shielding layer for shielding against electromagnetic interference influences;
   at least one circuit area;
   electronic components disposed in said at least one circuit area;
   at least three different bending areas each having a respective bending axis about which the printed circuit board can be bent;
   two of said bending axes being parallel to one another and at right angles to a third bending axis;
   at least two different printed circuit board areas separated from one another by bending areas;
   said shielding layer extending over said at least two different printed circuit board areas and over said three bending areas; and
   the printed circuit board being bent through substantially 180 degrees in each of said bending areas for shielding said at least one circuit area with said shielding layer against electromagnetic interference influences in at least four directions substantially at right angles to one another.

2. The circuit and flexible printed circuit board according to claim 1, wherein said metallization layer and said shielding layer are composed of the same conductive material.

3. The circuit and flexible printed circuit board according to claim 1, which further comprises conductive structures of said metallization layer and said shielding layer produced by removal of conductive material from the same conductive layer.

4. The circuit and flexible printed circuit board according to claim 1, which further comprises a layer containing gold for shielding against electromagnetic interference influences.

5. The circuit and flexible printed circuit board according to claim 1, wherein the printed circuit board bent in the bending areas causes said printed circuit board areas to bound a circuit volume including at least one side of said at least one circuit area and encapsulate said circuit volume.

6. The circuit and flexible printed circuit board according to claim 5, wherein said circuit volume is encapsulated with epoxy resin.

7. A hearing aid, comprising a circuit and flexible printed circuit board according to claim 1.

* * * * *